(12) United States Patent
Meyer

(10) Patent No.: US 7,035,104 B2
(45) Date of Patent: Apr. 25, 2006

(54) APPARATUS FOR HEAT TRANSFER AND CRITICAL HEAT FLUX ENHANCEMENT

(75) Inventor: Michael T. Meyer, Lafayette, IN (US)

(73) Assignee: Mudawar Thermal Systems Inc., West Lafayette, IN (US)

( * ) Notice: Subject to any disclaimer, the term of this patent is extended or adjusted under 35 U.S.C. 154(b) by 209 days.

(21) Appl. No.: 10/635,101

(22) Filed: Aug. 6, 2003

(65) Prior Publication Data
US 2004/0069451 A1    Apr. 15, 2004

Related U.S. Application Data

(60) Provisional application No. 60/401,421, filed on Aug. 6, 2002.

(51) Int. Cl.
*H05K 7/20* (2006.01)
(52) U.S. Cl. .............. 361/700; 257/715; 165/104.33; 361/699
(58) Field of Classification Search .............. 174/15.2; 257/714–715; 165/80.4, 104.33; 361/688–689, 361/698–702
See application file for complete search history.

(56) References Cited

U.S. PATENT DOCUMENTS

| | | | | |
|---|---|---|---|---|
| 3,524,497 A | * | 8/1970 | Chu et al. ................. | 165/80.4 |
| 3,609,991 A | * | 10/1971 | Chu et al. ..................... | 62/333 |
| 4,138,692 A | * | 2/1979 | Meeker et al. ............... | 257/697 |
| 4,203,129 A | * | 5/1980 | Oktay et al. ................. | 257/713 |
| 4,694,378 A | * | 9/1987 | Nakayama et al. .......... | 361/700 |
| 4,729,060 A | * | 3/1988 | Yamamoto et al. .......... | 361/700 |
| 4,928,207 A | * | 5/1990 | Chrysler et al. ............ | 361/700 |
| 5,097,385 A | * | 3/1992 | Chao-Fan Chu et al. ... | 361/703 |

OTHER PUBLICATIONS

Bowers, M.B. et al., High flux boiling in low flow rate, low pressure mini-channel and micro-channel heat sinks. Int. J. Heat Mass Transfer, vol. 37, No. 2, pp. 321-332, 1994, Great Britain.

Bowers, M.B. et al., Two-Phase Electronic Cooling Using Mini-Channel and Micro-Channel Heat Sinks: Part 1—Design Criteria and Heat Diffusion Constraints. Transactions of the ASME, vol. 116, pp. 290-297, Dec. 1994.

(Continued)

*Primary Examiner*—Gregory D Thompson
(74) *Attorney, Agent, or Firm*—Clifford W. Browning; Woodard, Emhardt. Moriarty, McNett & Henry LLP

(57) ABSTRACT

An apparatus for cooling single and multiple high-flux and ultra-high-flux heat dissipating devices, comprising a liquid coolant module having a base plate and a cover plate defining therebetween a liquid coolant chamber with a liquid coolant inlet port and a liquid coolant outlet port in fluid communication with the liquid coolant chamber; at least one heat dissipating device mounted to the liquid coolant module; a multi-level-cooling-enhancement stud mounted upon each heat dissipating device and disposed within the liquid coolant module; and apparatus for inducing phase change nucleate boiling of a subcooled liquid coolant within the liquid coolant module to enhance its cooling performance.

5 Claims, 9 Drawing Sheets

OTHER PUBLICATIONS

Bowers, M.B. et al., Two-Phase Electronic Cooling Using Mini-Channel and Micro-Channel Heat Sinks: Part 2—Flow Rate and Pressure Drop Constraints. Transactions of the ASME, vol. 116, pp. 298-305, Dec. 1994.

Collier, John G. et al., Convective Boiling and Condensation, 3rd Ed., Ch. 5, pp. 183-219, Oford Science Publications, Clarendon Press, Oxford.

Galloway, J.E. et al., CHF mechanism in flow boiling from a short heated wall—I. Examination of near-wall conditions with the aid of photomicrography and high-speed video imaging. Int. J. Heat Mass Transfer, vol. 36, No. 10, pp. 2511-2526, 1993, G.B.

Gersey, C.O. et al., Effects of Orientation on Critical Heat Flux From Chip Arrays During Flow Boiling. Transactions of the ASME, vol. 114, pp. 290-299, Sep. 1992.

Gersey, C.O. et al., Orientation Effects on Critical Heat Flux from Discrete, In-Line Heat Sources in a Flow Channel. Journal of Heat Transfer, vol. 115, pp. 973-985, Nov. 1993.

Jimenez, Peter E. et al., A Multi-Kilowatt Immersion-Cooled Standard Electronic Clamshell Module for Future Aircraft Avionics. Transactions of the ASME, vol. 116, pp. 220-229, Sep. 1994.

Katto, Y. et al., Upper Limit of CHF in the Saturated Forced Convection Boiling on a Heated Disk with a Small Impinging Jet. Journal of Heat Transfer, vol. 101, pp. 265-269, May 1979.

Mackowski, Michael J., Requirements for High Flux Cooling of Future Avionics Systems. SAE Technical Paper Series, 912104, Aerospace Technology Conference and Exposition, Long Beach, California, Sep. 23-26, 1991.

Maddox, D.E. et al., Single- and Two-Phase Convective Heat Transfer from Smooth and Enhanced Microelectric Heat Sources in a Rectangular Channel. Journal of Heat Transfer, vol. 111, pp. 1045-1052, Nov. 1989.

Monde, M. et al., Critical Heat Flux in Saturated Forced Convective Boiling on a Heated Disk with Multiple Impinging Jets. Transactions of the ASME, vol. 113, pp. 722-727, Aug. 1991.

Mudawar, I. et al., Direct-Immersion Cooling for High Power Electronic Chips, Intersociety Conference on Thermal Phenomena in Electronic Systems, Four Seasons Hotel, Austin, Texas, Feb. 3-5, 1992.

Mudawar, Prof. Issam, Keynote Address on Thermal Management. International Conference on Thermal, Mechanics and Thermomechanical Phenomena in Electronic Systems, Las Vegas, Nevada, May 23-26, 2000.

Mudawar, I. et al., Optimization of Enhanced Surfaces for High Flux Chip Cooling by Pool Boiling. Journal of Electronic Packaging, vol. 115, pp. 89-100, Mar. 1993.

Mudawar, I. et al. Immersion-Cooled Standard Electronic Clamshell Module: A Building Block for Future High-Flux Avionic Systems. Transactions of the ASME, vol. 116, pp. 116-125, Jun. 1994.

Mudawar, I. et al., Critical heat flux in subcooled flow boiling of fluorocarbon liquid on a simulated electronic chip in a vertical rectangular channel. Int. J. Heat Mass Transfer, vol. 32, No. 2, pp. 379-394, 1989, Great Britain.

Mudawar, I. et al., Critical heat flux from a simulated chip to a confined rectangular impinging jet of dielectric liquid. Int. J. Heat Mass Transfer, vol. 34, No. 6, pp. 1465-1479, 1991, Great Britain.

Nakayama, W. et al., Heat Sink Studs Having Enhanced Boiling Surfaces for Cooling of Microelectric Components. American Society of Mechanical Engineers, 84-WA/HT-89.

Peng, X. F. et al., Forced convection and flow boiling heat transfer for liquid flowing through microchannels. Int. J. Heat Mass Transfer, vol. 36, No. 14, pp. 3421-3427, 1993, Great Britain.

Advances in Thermal Modeling of Electronic Components and Systems, vol. 2, ASME Press Series, New York, 1990.

Ravigururajan, T.S., Impact of Channel Geometry on Two-Phase Flow Heat Transfer Characteristics of Refrigerants in Microchannel Heat Exchangers. Journal of Heat Transfer, vol. 120, pp. 485-491, May 1998.

Ruch, M.A. et al., Boiling Heat Transfer to a Freon-113 Jet Impinging Upward onto a Flat, Heated Surface. Int. J. Heat Mass Transfer, vol. 18, pp. 51-60, Pergamon Press, 1975, Great Britain.

Tuckerman, D.B. et al., High-Performance Heat Sinking for VLSI. IEEE ELectron Device Letters, vol. EDL-2, No. 5, pp. 126-129, May 1981.

Willingham, T.C. et al., Channel height effects on forced-convection boiling and critical heat flux from a linear array of discrete heat sources. Int. J. Heat Mass Transfer, vol. 35, No. 8, pp. 1865-1880, Great Britain 1992.

Yan, Yi-Yie et al., Evaporation heat transfer and pressure drop of refrigerant R-134a in a small pipe. Int. J. Heat Mass Transfer, vol. 41, pp. 4183-4194, Pergamon Press 1998.

* cited by examiner

APPARATUS FOR HEAT TRANSFER AND CRITICAL HEAT FLUX ENHANCEMENT

The present application claims the benefits of now abandoned U.S. Provisional Patent Application No. 60/401,421, filed Aug. 6, 2002.

This invention was made with Government support under contract DASG60-02-C-0050 awarded by U.S. Army Space and Missile Defense Command. The Government has certain rights in the invention.

This invention concerns cooling systems for heat source devices that produce large amounts of heat from relatively small surface areas, and which rely upon the removal of the heat produced to maintain desired functionality.

BACKGROUND OF INVENTION

Breakthroughs in many of today's cutting-edge technologies are becoming increasingly dependent upon the ability to safely dissipate enormous amounts of heat from very small areas. A key measure of heat dissipation density is heat flux, or heat removal rate divided by heat dissipation area. Two ranges of device heat fluxes can be identified relative to the magnitude of the heat dissipation and the type of coolant permissible in a particular application. These are the high-flux range, with heat flux requirements on the range of 100 to 1000 watts per square centimeter ($W/cm^2$), and the ultra-high-flux range, with heat fluxes exceeding. High-flux cooling systems are presently needed in many electronic and power applications, such as personal computers, mainframe computers, avionics (i.e., aviation electronics), fuel cells, and satellite electronics. Ultra-high-flux cooling systems, on the other hand, are important to defense lasers, microwave weapons, radars, x-ray medical devices, nuclear fusion reactors, rocket nozzles, and turbine blades.

Achieving reliable cooling for high-flux and ultra-high-flux applications typically requires pumping a liquid coolant at enormous flow rates through intricate cooling passages situated close to the heat-dissipating surface. Such coolant flows can produce extreme pressure drops, which necessitate the use of specialized powerful pumps. The challenge in cooling emerging and future devices and systems is to remove enormous amounts of heat using compact, lightweight cooling hardware, low coolant flow rates and relatively low pressure drops. This is a formidable challenge considering that such coolant conditions are typically incompatible with high-flux removal.

Heat removal from electrical-current-carrying devices poses many unique challenges. High performance computer chips are a prime example of an application that is constantly demanding new, aggressive cooling solutions. Despite the many recent signal speed-enhancing breakthroughs in such areas as superconductivity, optical transmission, gallium arsenide semiconductors, and parallel processing, the ever increasing demand for greater signal speed has created major challenges to the manufacturers of both commercial and defense electronics. These challenges are difficult to meet even with today's most cutting-edge cooling technologies.

In fact, heat removal has emerged as an obstacle to electronic packaging at all levels: device, multi-device module, and system. One reason for this trend is the alarming increase in the number of electronic components that are being packaged into the device itself (e.g., computer processor) through aggressive micro-miniaturization. Thermal management obstacles have also been compounded by the increased signal speed requiring shorter distances between devices in multi-device modules and a closer packaging of modules in a cooling system.

Air cooling is still widely used and will always be favored, where possible, over all other cooling techniques; but the poor thermal transport properties of air require forced circulation at speeds that often exceed upper accepted limits for noise and vibration. To avoid exceeding those limits, many high-power devices can be found mounted on massive fins—heat sinks—which are intended to greatly increase the surface area available for air cooling. Even with the finning and the increased air speed, air is not likely to handle the high heat fluxes projected for the next generation of devices while maintaining acceptable device temperatures. For this reason, new cooling technologies have emerged in recent years that rely upon direct or indirect cooling with liquids.

Different types of liquids can be used in high-flux and ultra-high-flux cooling systems. These include water, fluorochemicals, glycols, oils and liquid metals. Fluorochemical liquids have received considerable attention for electronic cooling applications because their cooling performance is vastly superior to that of air. Furthermore, many of these coolant possess excellent dielectric properties; these liquids can be used in direct contact with an electronic or electrical device without short-circuiting components in the device itself or the connector board. However, the cooling effectiveness of fluorochemicals is quite inferior to that water, which explains why many high-flux and ultra-high-flux devices are cooled with water.

Aside from the type of liquid coolant used, cooling effectiveness can be greatly improved by pumping the coolant to the heat-dissipating device surface at high speed, and more importantly, by allowing the coolant to undergo a change-of-phase, from liquid to vapor, i.e., by boiling upon the device surface.

For liquid-cooled devices, when the device heat dissipation level is relatively small, the heat is removed by heat transfer to the liquid without boiling. This form of heat transfer is associated with a fairly linear increase of device temperature with increasing device heat dissipation rate. Boiling commences on the device surface after the device temperature exceeds the liquid's boiling temperature. The growth and departure of vapor bubbles on the device surface draws liquid toward the device surface at high frequency which, along with the ensuing latent heat exchange resulting from the vapor production, greatly increase cooling effectiveness. Any subsequent increase in the device heat dissipation rate is removed with only a modest increase in the device temperature. Thus, the device temperature is much lower in the presence of boiling than with pure liquid cooling.

The attractive cooling performance associated with boiling is realized in the so-called nucleate boiling regime. Cooling effectiveness within this regime requires uninterrupted liquid access to the device surface to replace the vapor released in the form of bubbles. Higher heat dissipation rates are removed by the production of more vapor bubbles per unit surface area. While this increased vapor bubble formation is beneficial to the heat removal process, it can also produce appreciable bubble crowding and bubble coalescence upon the device surface. As the heat dissipation rate increases further, the bubble crowding and coalescence begin to restrict liquid access to the device surface. A condition is eventually reached when the liquid access is interrupted, and heat that is dissipated by the device itself can longer be removed by the liquid—the device temperature begins to escalate uncontrollably. This condition is the upper limit for the nucleate boiling regime and is termed critical heat flux (CHF). CHF constitutes the upper heat dissipation design limit for most cooling systems that employ boiling.

Airborne and space-based electronic systems pose packaging constraints that are far more stringent than those of even mainframe and supercomputers. Due to severe weight and volume limitations, the electronics in these systems must be configured using compact, lightweight two-dimensional and three-dimensional architectures. Close proximity between devices, in addition to the aforementioned high concentration of integrated circuits in the device itself, has led to enormous heat dissipation rates in several aerospace and defense systems.

One important application of defense electronics is high power lasers. These lasers are used for targeting, tracking, and in communications systems. Unfortunately, lasers are thermally inefficient, i.e., enormous amounts of heat are needlessly dissipated and have to be safely removed to maintain system integrity. The heat fluxes associated with these heat dissipation systems greatly exceed those encountered in even the most powerful commercial lasers and therefore require high performance liquid cooling schemes.

A key concern in the implementation of a cooling scheme in defense applications is the large differences in operating environment for different defense platforms. Each platform (ground, air, sea or space) imposes stringent requirements concerning such important parameters as weight, volume, shock, vibration, ambient temperature, and G-force. The latter is of particular concern to military aircraft whose maneuvers create large forces that complicate liquid flow inside cooling modules, especially where vapor is present due to boiling.

Numerous cooling schemes have recently been developed for high-flux heat removal from electronic devices. Each scheme provides specific merits for a particular application. Unlike most recently developed cooling schemes, which seem to target cooling fluxes of about 100 W/cm$^2$, the present invention concerns a cooling scheme that is capable of exceeding 1000 W/cm$^2$ in order to serve electronic, aerospace and defense needs for decades to come.

High liquid coolant flow rates are often needed to meet high-heat-flux cooling requirements, and such flow rates are typically associated with extreme pressure drops, especially when implemented with boiling. However, many of the applications for which the present invention are intended do not use massive liquid pumps or complicated coolant conditioning loops. What is therefore needed for these applications is a cooling system that is capable of meeting the intense cooling demands, but requires low flow rates and low to moderate pressure drops.

Due to the liquid motion, significant bubble coalescence can occur over a multi-device module as illustrated in FIG. 1A. This is especially the case where a saturated liquid coolant 1 is used, i.e., where the liquid is supplied at the boiling temperature. As illustrated in FIG. 1A, gradual stream-wise bubble coalescence can result in appreciable thickening of a vapor layer 2 along the surfaces of the devices 3. This phenomenon can trigger CHF prematurely on downstream devices.

These problems can be alleviated by subcooling the liquid, i.e., by supplying it at a temperature much lower than the boiling temperature. Subcooled flow is categorically different from saturated flow in all stages of the vapor layer development. As shown in FIG. 1B, a highly subcooled liquid 4 may result in complete condensation of vapor bubbles 2 back into liquid state only a short distance downstream of the device from which the bubbles are generated. Thus, subcooled flow takes full advantage of nucleate boiling while ensuring the coolant would exit the cooling module in liquid state.

The coolant exiting the cooling module is typically returned to the module at the desired temperature, pressure and flow rate with the aid of an external coolant conditioning loop. The presence of vapor at the module exit can complicate the operation of the conditioning loop. Thus, by completely condensing the vapor before exiting the module, subcooled flow would require a relatively simple liquid loop to condition the coolant external to the module.

Another important advantage of subcooled flow is that the rapid condensation of bubbles maintains liquid access to the device surface during intense heat removal. This a powerful means for delaying CHF, i.e., allowing larger heat removal rates than with saturated flow.

CHF is the upper design limit for most cooling systems that employ boiling. Exceeding this limit can result in permanent device damage or burnout. Adopting methods that delay (i.e., increase) CHF amounts to extending the nucleate boiling regime to accommodate higher heat removal rates.

Published studies point to (1) increasing liquid velocity, (2) increasing subcooling, and/or (3) surface enhancement (i.e., incorporating surface fins) as three effective methods for delaying CHF. However, delaying CHF is sometimes realized with cooling system penalties. For example, large liquid velocities require large flow rates and produce large pressure drops. These will both require a large pump and increase the size and weight of the coolant conditioning loop. As indicated above, practical considerations in many of the applications of the invention are intended for favor compact, lightweight components, hence the need to avoid large flow rates or excessive pressure drops.

BRIEF SUMMARY OF THE INVENTION

The present invention are novel liquid coolant modules that are intended for cooling of single or multiple high-flux and ultra-high-flux heat dissipating devices such as electronic chips, power devices, and laser diodes. One embodiment of the present invention is an apparatus for cooling single and multiple high-flux and ultra-high-flux heat dissipating devices, comprising a liquid coolant module having a base plate and a cover plate defining therebetween a liquid coolant chamber with a liquid coolant inlet port and a liquid coolant outlet port in fluid communication with the liquid coolant chamber; at least one heat dissipating device mounted to the liquid coolant module; a multi-level-cooling-enhancement stud mounted upon each heat dissipating device and disposed within the liquid coolant module; and means for inducing phase change nucleate boiling of a subcooled liquid coolant within the liquid coolant module to enhance its cooling performance.

DETAILED DESCRIPTION OF THE INVENTION

Figure 1A:
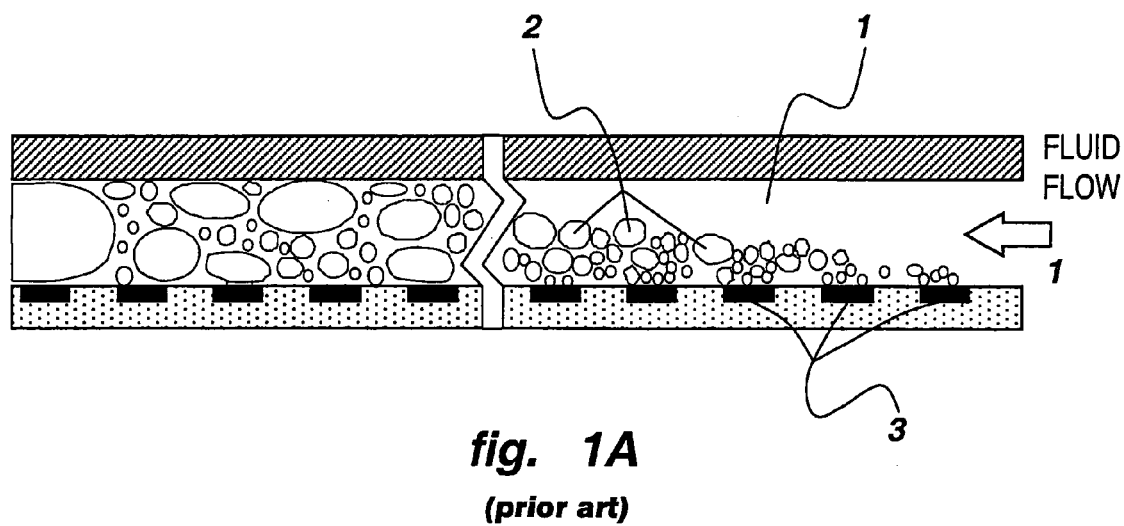
FIG. 1A illustrates prior art bubble coalescence over a multi-device module when a saturated liquid coolant is used.
Figure 1B:
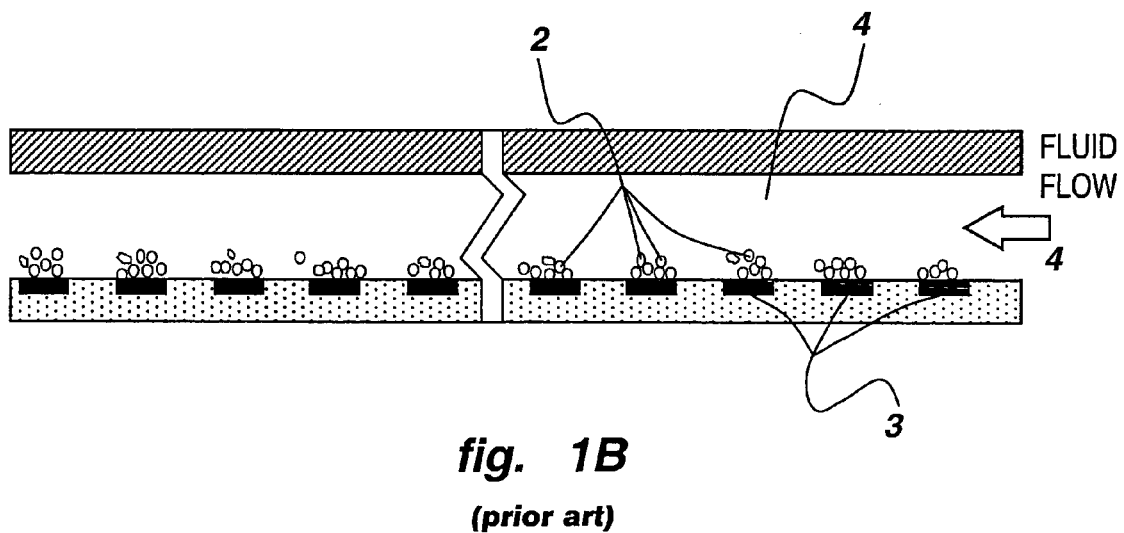
FIG. 1B illustrates prior art bubble coalescence over a multi-device module when a saturated liquid coolant is used.
Figure 2A:
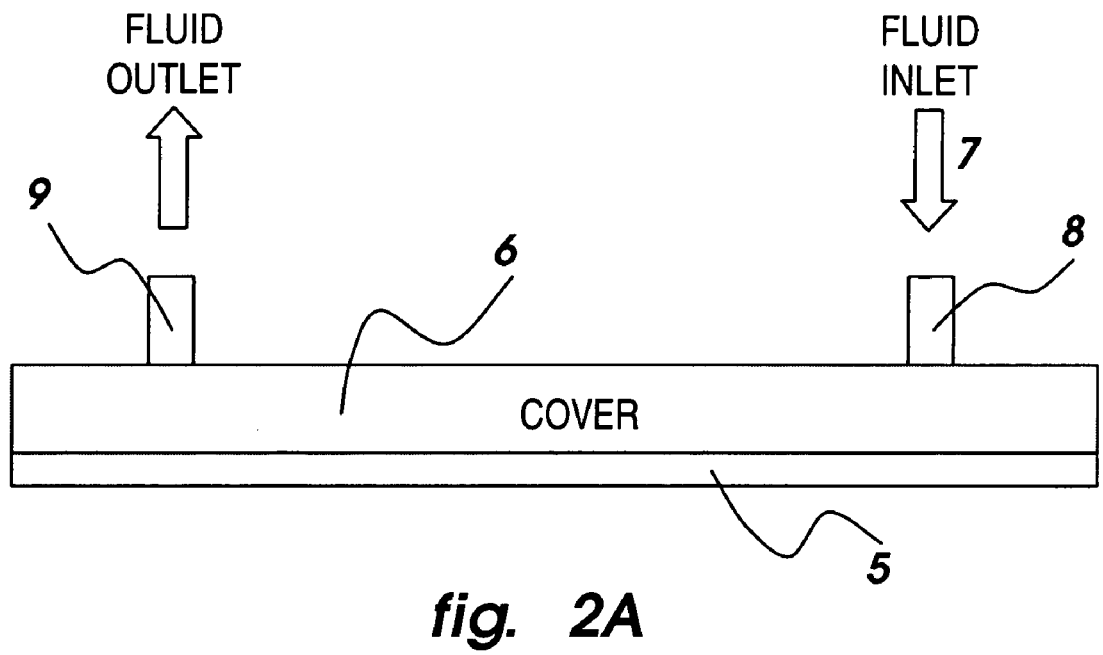
FIGS. 2A–2B illustrate a front elevational view and a top plan view of one embodiment of the liquid coolant module of the present invention.
Figure 2B:
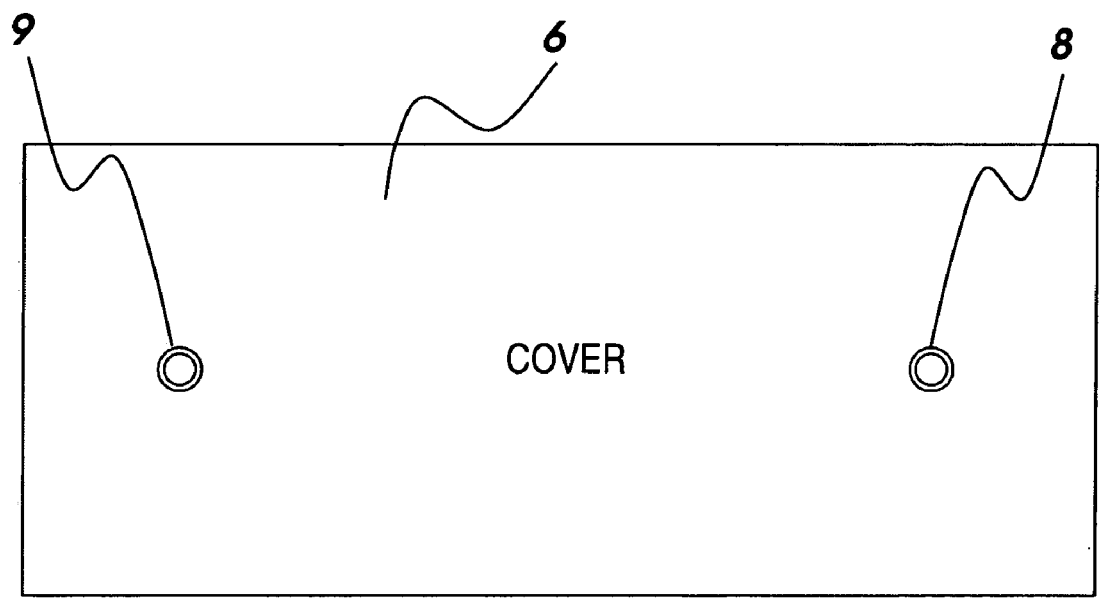
Figure 3A:
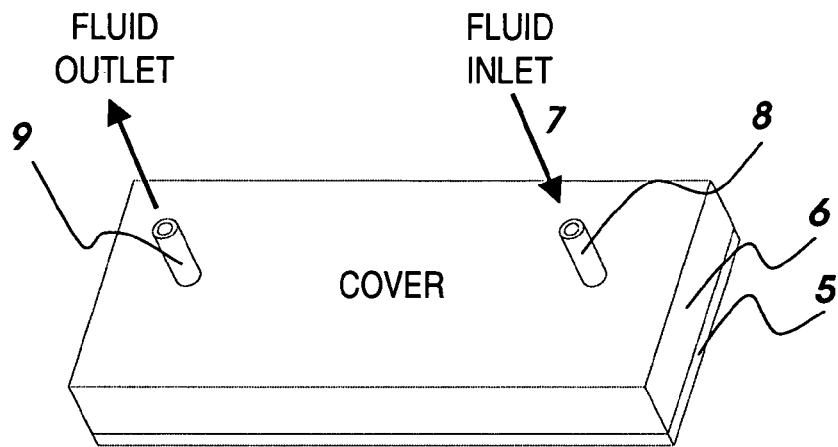
FIGS. 3A–3C illustrate alternative liquid coolant inlet and outlet port configurations of the present invention.
Figure 3B:
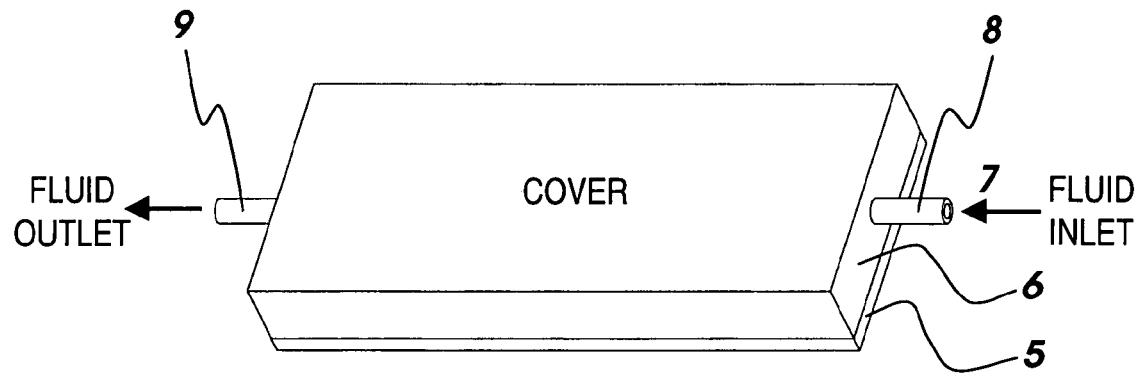
Figure 3C:
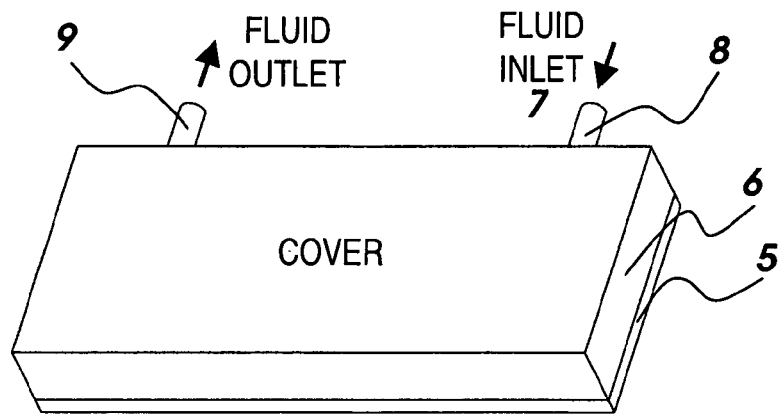

Heat dissipating devices 10 are embedded in the base plate 5 of the module illustrated in FIGS. 2A and 2B, and a cover plate 6 is used to introduce a liquid coolant 7 through an inlet port 8 into the module, to control coolant path within the module cavity, as well as to expel the coolant from the module through an outlet port 9. Different inlet and outlet configurations can be used with this module as illustrated in FIGS. 3A–3C. The coolant is conditioned by a flow loop external to the module (conditioning loop is not part of the present invention) that returns the coolant to the module at the appropriate temperature, pressure and flow rate.

Figure 4A:
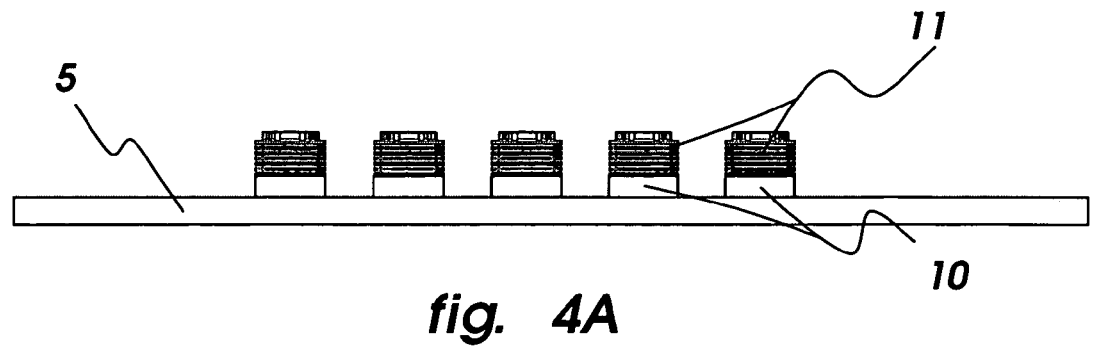
FIGS. 4A–4B illustrate heat dissipating devices mounted on a top surface of the base plate of the liquid coolant module of the present invention with multi-level-cooling-enhancement studs mounted on the top of each.
Figure 4B:
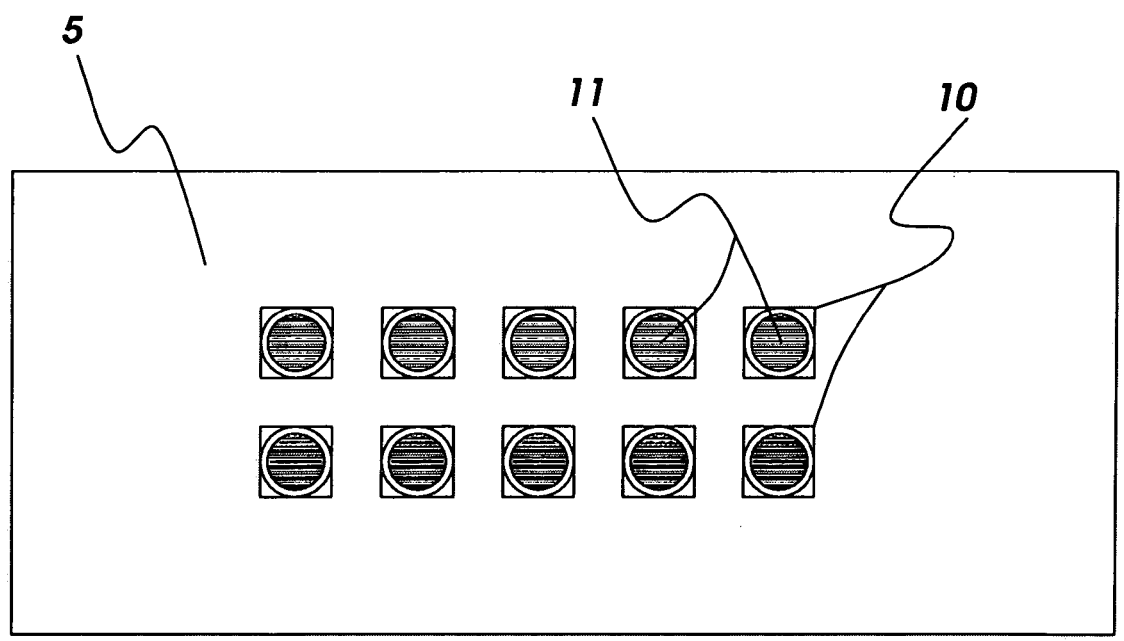
Figure 5A:
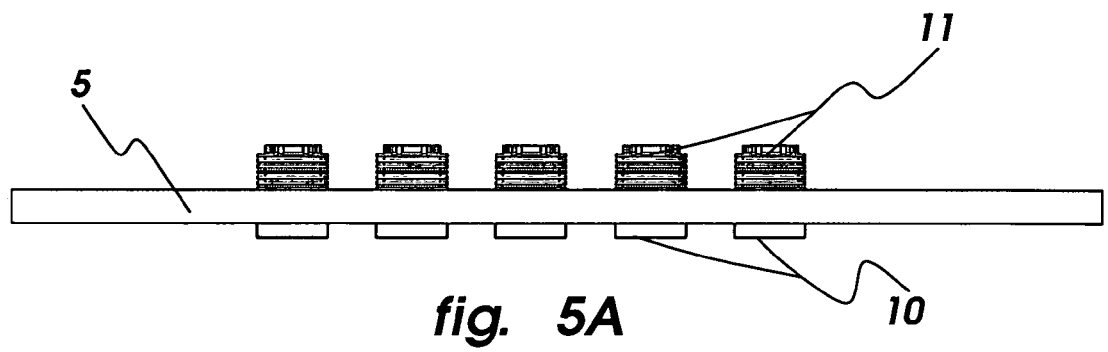
FIGS. 5A–5B illustrate heat dissipating devices mounted to an underside surface of the liquid coolant module of the present invention with multi-level-cooling-enhancement studs mounted on the top of each.
Figure 5B:
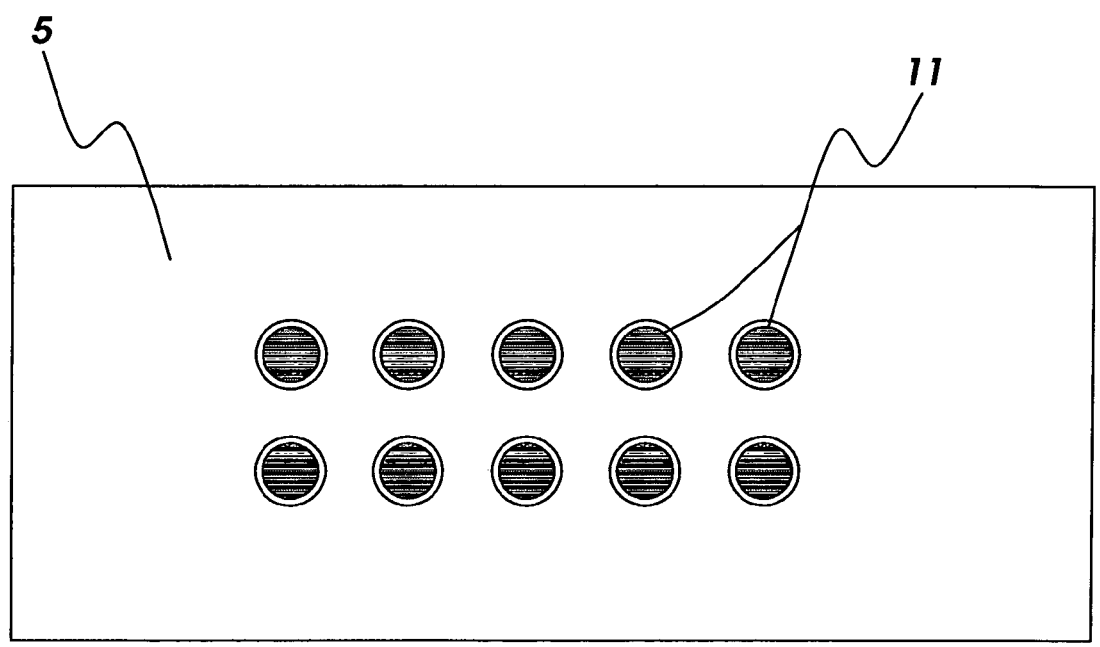

Inside the module, the liquid extracts the heat from the devices 10 by turning partially into vapor through boiling. The liquid is supplied at the module inlet 8 in a subcooled state, i.e., at a temperature much lower than the liquid's boiling temperature corresponding to the inlet liquid pressure. This results in subcooled nucleate boiling within the module. As shown in FIGS. 4A and 4B, the devices 10 are mounted on the top surface of the base plate 5, and the surface of each device 10 is fitted with a multi-level-enhancement stud 11 (described below) that both increases the area available for heat removal and enhances the nucleate boiling process. FIGS. 5A and 5B show the heat dissipating devices 10 can also be mounted to the underside of the base plate 5, permitting a monolithic base plate design with all the studs 11 machined into the same base plate material.

Figure 6A:
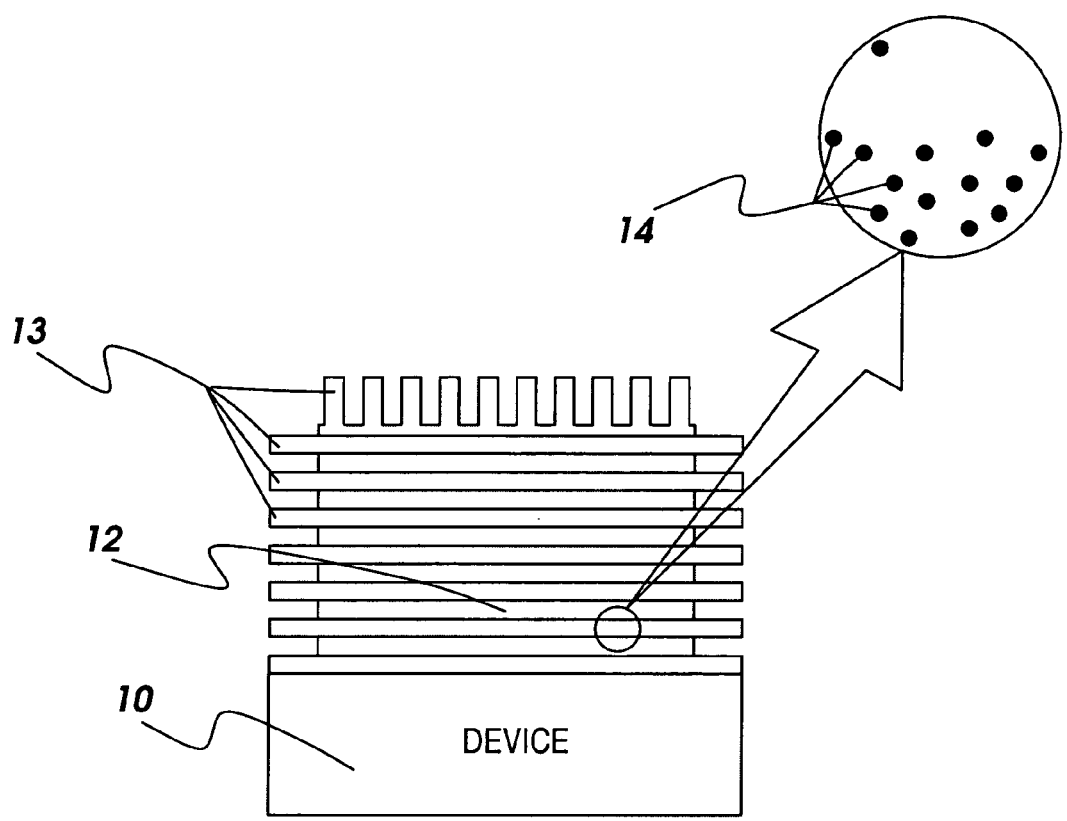
FIGS. 6A–6B illustrate the basic construction of the multi-level-cooling-enhancement studs of the present invention.
Figure 6B:
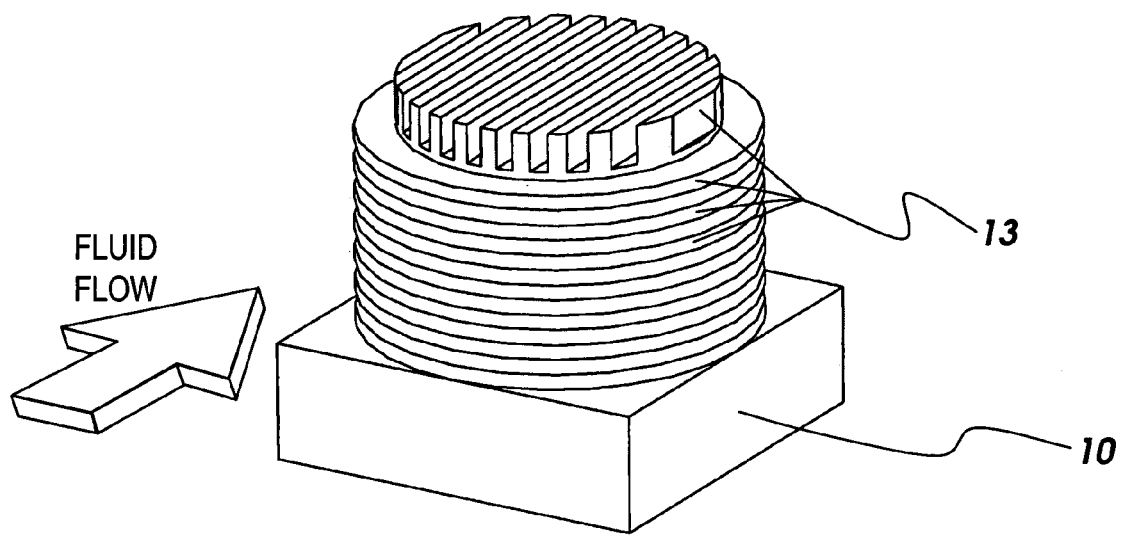

FIGS. 6A and 6B illustrate the basic construction of the multi-level-cooling-enhancement stud 11. The stud consists of (a) a centimeter-scale cylindrical core 12 (fraction of a centimeter to a couple of centimeters in length and diameter) that increases the overall heat removal area, (b) millimeter-scale fins 13 (fraction of a millimeter to a couple of millimeters in height, width and spacing between fins) that further increase the heat removal area as well as create surface features that promote bubble formation, and (c) micrometer-scale surface texture 14 that provides an abundance of surface pores (fraction of a micron to a few microns in diameter) from which bubbles can nucleate. The millimeter-scale fins are formed both along the circumference and top surface of the stud 11.

Since much of the difficulty in constructing a test module is associated with the machining of the multi-level-cooling-enhancement stud 11 itself, all the complexities of coolant entry into and exit from the module, as well as coolant path within the module cavity, are incorporated into the cover plate 6.

Figure 7:
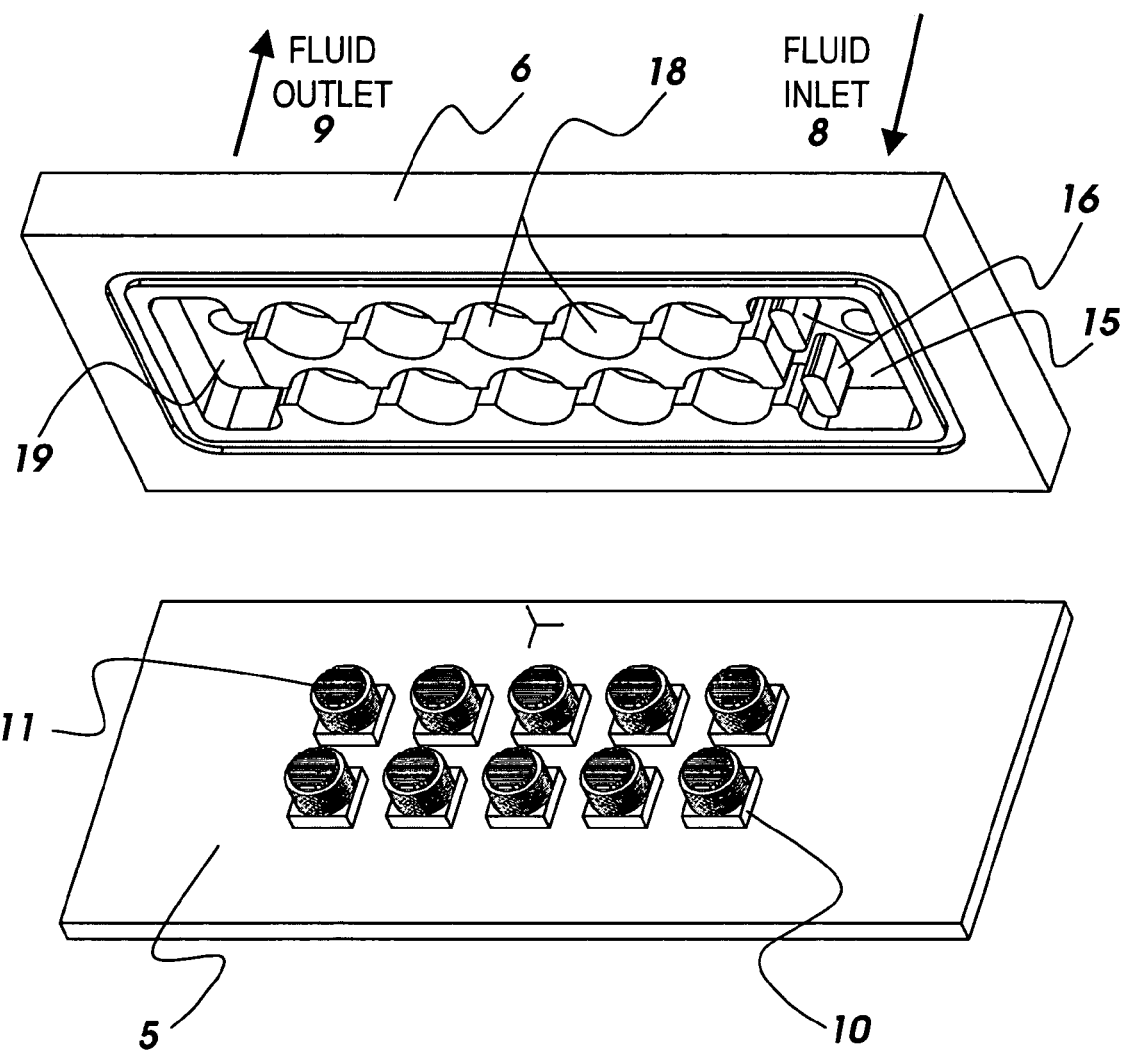
FIGS. 7–8 illustrate the preferred cover plate cylindrical cavities that encompass the multi-level-cooling-enhancement studs in the base plate with narrow passages therebetween for liquid coolant flow.
Figure 8:
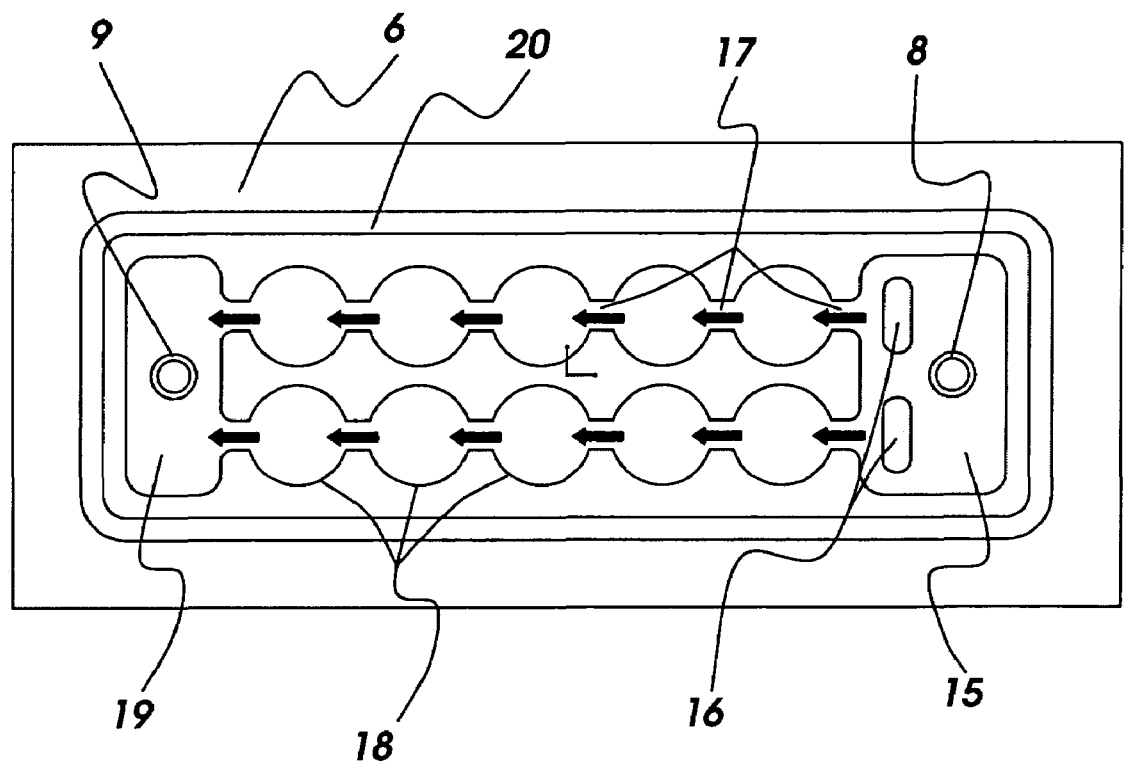

As shown in FIGS. 7 and 8, the coolant is introduced through the top of the cover plate 6 into a shallow inlet plenum 15 within the cover plate 6. Small rectangular protrusions within the inlet plenum 15 act as baffle plates 16 to interrupt the coolant flow and divide it uniformly into parallel narrow jets 17 that produce cross flow along rows of studs 11.

This flow distribution geometry offers several important advantages. First, any large non-uniformities in the flow resulting from liquid entry into the upstream plenum are dampened by the baffle plates 16 well upstream of the studs 11. Second, the flow area is decreased upstream of the studs 11 to gain impact velocity without increasing coolant flow rate.

FIGS. 7 and 8 show the cover plate 6 contains cylindrical cavities 18 that encompass the studs 11 in the base plate 5, leaving only a narrow passage for the coolant flow. Following impact with the stud 11, the flow is confined both circumferentially as well as along the top surface of the stud 11. This helps control the coolant flow during the entire duration of coolant interaction with stud 11 surfaces.

FIGS. 7 and 8 show an outlet plenum 19 in the cover plate 6 beneath the coolant outlet 9. Including a baffle plate in the outlet plenum is avoided since flow control of the spent coolant has little bearing on cooling performance, let alone the added pressure drop penalty associated with including baffle plates in the outlet plenum 19. To seal the module assembly, an o-ring is set in a groove 20. Otherwise, the module can be sealed by soldering or brazing the cover plate 6 to the base plate 5 without the need for an elastic seal.

This cooling module of the present invention is particularly suited for devices that dissipate large amounts of heat per unit surface area. Heat removal from such devices is accompanied by intense boiling. Vapor bubbles nucleate, grow, and depart at high frequency, constantly being replaced by incoming liquid coolant. The intense boiling is vital to the effectiveness of the cooling process provided the vapor bubble layer does not interrupt liquid access to the heat-dissipating surface. Excessive vapor production can therefore be detrimental, resulting in burnout of the device due to CHF. The cooling module of the present invention, as described, is especially effective at combating this problem, i.e., at delaying CHF.

Another detrimental effect of excessive vapor production is the formation of large vapor pockets within the module. Depending on the orientation of the module relative to Earth's gravity, the large vapor masses may interfere with the incoming liquid or tend to accumulate in one corner of the module, creating local burnout in that corner. This problem is far more serious in devices that are used on board military aircraft, where the large forces created by the aircraft maneuvers can accumulate virtually all the vapor in one corner of the module. The cooling module of the present invention, as described, is highly effective at combating this problem as well.

While existing cooling modules do capitalize on certain mechanisms and techniques to enhance cooling performance, the cooling module of the present invention combines in a new and unique fashion a large number of highly effective cooling enhancement mechanisms and techniques, including the following.

It utilizes a multi-enhancement stud 11 involving (a) a centimeter-scale cylindrical core that increases the overall heat removal area, (b) millimeter-scale fins 13 that further increase the heat removal area as well as create surface features that promote bubble formation, and (c) micrometer-scale surface texture 14 that provides an abundance of surface pores from which bubbles can nucleate.

It utilizes phase change (nucleate boiling) to greatly enhance cooling performance.

Figure 9:
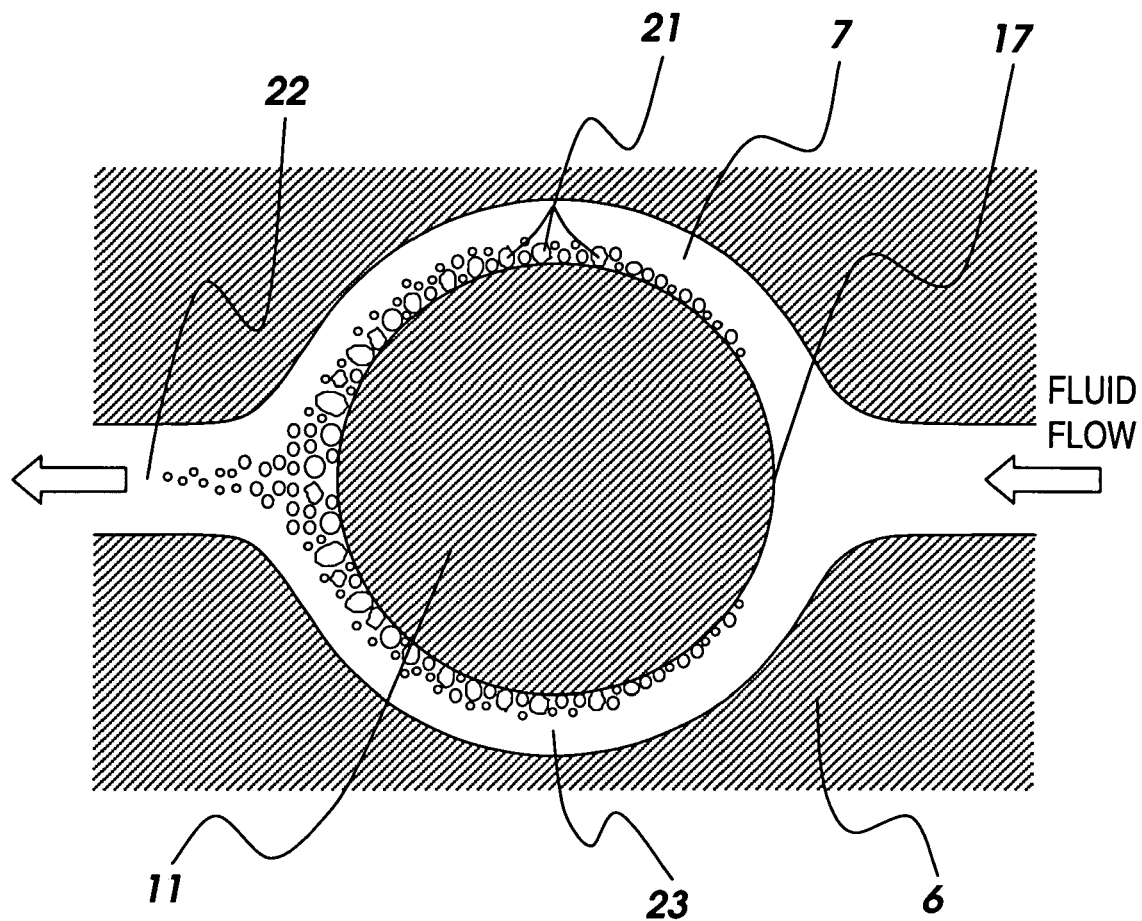
FIG. 9 illustrates the condensing of vapor bubbles before they coalesce into larger vapor masses as a result of the present invention.

It reduces vapor buildup by condensing vapor bubbles before they coalesce into large vapor masses, as illustrated in FIG. 9. A thin vapor layer 21 implies liquid can more easily access the surfaces of the device 10 and stud 11 and maintain the boiling process, thereby providing much greater resistance to burnout due to CHF.

It utilizes subcooled liquid 7 that can absorb more heat before even beginning to boil, and can therefore greatly enhance resistance to burnout due to CHF.

It capitalizes upon penetration of the stud 11 into the subcooled liquid 7 to better utilize the cooling effect of this low temperature liquid.

It utilizes subcooling to reduce overall vapor buildup. Due to the small mass of vapor generated within the cooling module, there are weaker body force effects on cooling performance. This renders the module's cooling performance far less sensitive to orientation or to military aircraft maneuvers.

It utilizes subcooling of the incoming liquid to promote vapor condensation 22 prior to exiting the module, as illustrated in FIG. 9. This feature simplifies the coolant conditioning loop external to the cooling module by relying on a simple single-phase (i.e., liquid only) coolant conditioning loop rather than a more complex liquid-vapor loop.

It utilizes jet-impingement 17 (i.e., cross-flow) of liquid against the front of the extended stud 11, FIG. 9, which clears most vapor in the front impact region, even with intense vapor production occurring along the top and downstream circumference of the stud 11. The continued upstream liquid access to the stud 11 surface serves as a guard against burnout due to CHF for devices requiring intense heat removal.

As illustrated in FIG. 9, the narrow (micro-channel or mini-channel) flow passages 23 in the cover plate 6 control the coolant path along the device 10 and stud 11 surfaces, bringing bulk subcooled coolant in close proximity to these surfaces.

Using narrow flow passages 23 around the circumference and top surface of the stud 11, FIG. 9, produces large liquid speeds (for a given liquid flow rate) that greatly enhance resistance to burnout due to CHF.

Use of small flow passages reduces coolant flow rate requirements.

Despite its use of small flow passages 23, the increased coolant flow area due the studs 11 precludes excessive pressure buildup across the cooling module.

The high coolant speeds help flush vapor masses out of the module. This renders the module's cooling performance far less sensitive to orientation or to military aircraft maneuvers.

I claim:

1. An apparatus for cooling single and multiple high-flux and ultra-high-flux heat source devices, comprising a liquid coolant module having a base plate and a cover plate defining therebetween a liquid coolant chamber with a liquid coolant inlet port and a liquid coolant outlet port in fluid communication with the liquid coolant chamber;

at least one heat dissipating device mounted to the base plate;

a multi-level-cooling-enhancement stud mounted upon each heat dissipating device and disposed within the liquid coolant chamber, each multi-level-cooling-enhancement stud includes a centimeter-scale cylindrical core and millimeter-scale fins having micro-scale surface textures inducing phase change nucleate boiling of a subcooled liquid coolant within the liquid coolant chamber to enhance the liquid coolant module's cooling performance.

2. The apparatus of claim 1 and further comprising means for reducing vapor buildup from the phase change nucleate boiling of a subcooled liquid coolant by condensing vapor bubbles from the phase change nucleate boiling before they coalesce into large vapor masses.

3. The apparatus of claim 1 wherein each multi-level-cooling-enhancement-stud is disposed to be submerged within the liquid coolant flowing through the liquid coolant chamber from the liquid coolant inlet port to the liquid coolant outlet port.

4. The apparatus of claim 3 and further comprising means to induce jet-impingement cross-flow of the liquid coolant within the liquid coolant module against surfaces of each multi-level-cooling-enhancement stud in closest proximity to the liquid coolant inlet port to thereby clear away from these surfaces vapor generated from phase change nucleate boiling.

5. The apparatus of claim 4 wherein the means to induce the jet-impingement cross-flow of the subcooled liquid coolant includes micro-enhanced or mini-channel liquid coolant flow passages within the liquid coolant module to direct liquid coolant flow to each multi-level-cooling-enhancement stud at a speed greater than the speed of the liquid coolant flowing through the liquid coolant inlet port.

* * * * *